United States Patent [19]

Ishii et al.

[11] Patent Number: 4,631,800
[45] Date of Patent: Dec. 30, 1986

[54] ELECTRONIC PARTS OUTFITTING DEVICE

[75] Inventors: Taira Ishii, Kadoma; Yoshihiko Misawa; Yoshinobu Maeda, both of Katano; Souhei Tanaka, Neyagawa, all of Japan

[73] Assignee: Matsushita Electric Industrial Co. Ltd., Kadoma, Japan

[21] Appl. No.: 717,274

[22] PCT Filed: Jul. 20, 1983

[86] PCT No.: PCT/JP83/00233
§ 371 Date: Mar. 20, 1985
§ 102(e) Date: Mar. 20, 1985

[87] PCT Pub. No.: WO85/00724
PCT Pub. Date: Feb. 14, 1985

[51] Int. Cl.[4] .............................................. B23Q 41/00
[52] U.S. Cl. ................................ 29/564.6; 29/564.7; 29/566.2
[58] Field of Search ............... 29/564.6, 564.7, 564.2, 29/564.3, 566.2, 564.1, 566.3, 564.8, 753, 33 M, 836, 837, 741

[56] References Cited

U.S. PATENT DOCUMENTS

| | | | |
|---|---|---|---|
| 3,521,347 | 7/1970 | Bentley | 29/564.3 |
| 3,777,350 | 12/1973 | Maeda | 29/564.1 X |
| 4,205,433 | 6/1980 | Araki | 29/564.8 |
| 4,245,385 | 1/1981 | Zemek | 29/741 X |
| 4,263,708 | 4/1981 | Takahashi | 29/564.6 X |
| 4,294,000 | 10/1981 | Takahashi | 29/566.2 X |
| 4,313,251 | 2/1982 | Asai et al. | 29/564.6 |
| 4,344,219 | 8/1982 | Tanabe et al. | 29/564.6 |
| 4,403,390 | 9/1983 | Woodman, Jr. | 29/564.1 |
| 4,527,324 | 7/1985 | Dean | 29/564.6 |

FOREIGN PATENT DOCUMENTS 544373 1/1979 Japan ........................ 29/741

Primary Examiner—William R. Briggs
Attorney, Agent, or Firm—Wenderoth, Lind & Ponack

[57] ABSTRACT

An electronic part mounting device having tape feeding units for holding and intermittently transferring electronic part assemblies each having a plurality of electronic parts fixed on tapes at specified intervals, a movable table being in a disc shape and rotatably installed for transferring the removably installed tape feeding unit to a specified first position, pressure clampers each removably mounted on the aforementioned movable table in proximity and in correspondence with the tape feeding unit, an inserting head as the working head for taking each electronic part off the electronic part assembly at the first position and then, holding and transferring the electronic part to a second position apart from the moving path of the movable table where this electronic part is mounted on a printed substrate, a chute located beneath the bottom of the movable table in correspondence with the aforementioned tape feeding unit for guiding to near the center of rotation of the movable table tape scraps and which have been cut off the taped electronic part assemblies and a tape cutter capable of cutting the tape scraps, located and between the chute and the center of rotation of the movable table, which does not intefer with the chute or the movable table. The device has the advantage of enabling random selection of electronic parts without sequentially arranging the electronic parts, has the effect of being unrestricted in the direction of mounting the electronic part on the printed substrate and in addition, permits integral holding and ready removal of the tape feeding unit and the electronic part assembly and moreover, cutting disposal of tape scraps and at a specified length.

4 Claims, 18 Drawing Figures

ELECTRONIC PARTS OUTFITTING DEVICE

TECHNICAL FIELD

The present invention relates to an electronic parts mounting device for automatically mounting a variety of electronic parts on respective specified positions on a printed substrate from a unit of such a device and provides such an mounting device intended for enabling its efficient utilization in the phase of maintenance and workability.

BACKGROUND ART

Heretofore available as devices for automatically making continuous mounting of different types of electronic parts such as a resistor (FIG. 1a), a diode (FIG. 1b), etc., were those which were roughly categorized into two types by the feeding method of the aforementioned electronic parts.

Figure 2:
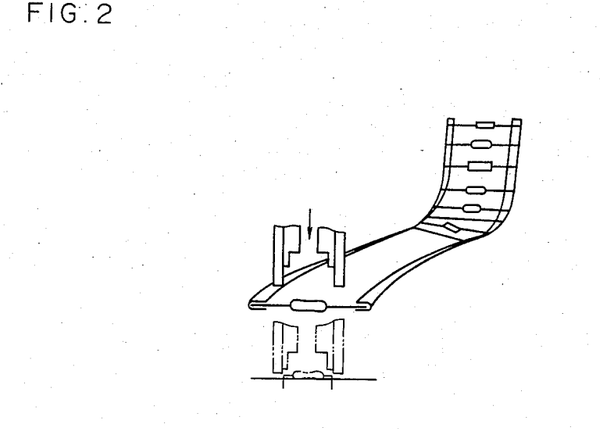
FIG. 2 is a schematic diagram for explanation of a conventional part inserting device.

Known inserting devices include a first system in which, for example, an assembly is prepared wherein electronic parts, which are different in type, are arranged in a band shape beforehand in the order of their insertion; such an assembly is directly fed to an insertion head, to make successive insertion of the parts (FIG. 2).

On the other hand a second system is available in which assemblies of the needed types of electronic parts are prepared, same type of electronic parts in a band shape; at the times of inserting respective electronic parts, such assemblies are selected in the order of insertion and the needed electronic part at a time is separated from each of the aforementioned assemblies and such parts are, then, conveyed to the insertion head for their insertion by means such as a belt, pipe, etc. These methods have the following disadvantages, respectively:

Thus in the first system, a plurality of different types of parts need to be prepared as an assembly in a taping band shape; in such an assembly, their replacement can not be made, if insertion mistakes have occurred in any circumstances.

On the other hand, in the second system, because of the use of a conveyor or pipe, its turning or tilting while conveying the parts interferes with their stable feeding to the insertion head. Furthermore, because a long time is taken to transport the parts, the number of insertion cycles of the parts can not be increased. Moreover, outer walls of the conveyor and pipe tend to injure parts or deform lead wires.

Against this background, there has already been proposed and put into practical use a new type of inserting device capable of solving such disadvantages of the aforementioned devices adapted for continuous insertion of different types of parts. This device employs the type of arrangement disclosed in U.S. Pat. No. 4205433 in which a means is provided for holding a plurality of taped assemblies side by side, each assembly comprising electronic parts of same type and transferring one of the aforementioned plurality of electronic part assemblies to the specified position for feeding the part. In addition an insertion head makes a reciprocal motion between the aforementioned part feeding position and the position adjacent a printed substrate, located apart from the part feeding position, to transfer the single electronic part which has been cut off the electronic part assembly at the part feeding position to a position in proximity to the printed substrate and at this latter position, the electronic part is inserted into the aforementioned printed substrate. This system is called random access type, as against the sequential type of the aforementioned first system. The insertion device of this system has outstanding effects in response to insertion mistake of electronic part and stability in insertion.

On the other hand, in the advancing field of automation by use of such mounting devices of electronic parts, needs exist not only for stabilization of arrangement but for dealing with the project of growing forming lines with various types of automatic mounting devices and there is a demand for development of mounting devices which are to be designed for high work efficiency in totality through effective utilization of machine installing space and improvement in productivity.

With regard to the device disclosed by the aforementioned U.S. Pat. No. 4205433, a plurality of electronic part assemblies are mounted parallel to each other on a movable stand in one direction; the movable stand is moved along a straight line to bring a specified part to the vicinity of the insertion head position, which requires a large space in the length direction of the machine, raising the problem of the whole size of the machine becoming too large. In addition a tape feeding unit is fixed to the movable table, causing trouble in displacement of parts and low workability; moreover, the tape scraps produced after the taped electronic parts have been inserted are discharged as they are; this poses the problem of such tape scraps coiling around the tape feeding unit, when it is attached or detached.

In connection with the problem of space mentioned above, a device for providing a more advantageous system is disclosed by Japanese Patent Gazette No. 66466 of 1979. In this device, the electronic part assemblies are placed further outside the tape feeding unit which is located at the outer periphery of a movable stand in the shape of a circular table and an insertion head provided with a turret type insertion chuck mechanism effects sequential insertion of electronic parts.

This device has such disadvantages as hereunder enumerated: First, a cartridge type arrangement is formed by unifying the tape feeding unit and the electronic part assemblies, but this requires time in their attaching and detaching. Secondly, for performing tape scrap disposal, tape cutting mechanisms are equipped in all tape feeding units mounted on the circular table, resulting in high manufacturing cost. And thirdly, in the event of a mistaken insertion, while the inserting device is in operation, the same parts can not be resupplied, because of the sequential insertion of electronic parts.

DISCLOSURE OF THE INVENTION

The device of this invention has tape feeding units each for holding and intermittently transferring a taped electronic part assembly having at fixed at specified intervals a plurality of electronic parts, etc., provided with lead wires coaxially extending from both ends of each body; a movable table being in disk shape and rotatably installed for transferring the aforementioned tape feeding unit removably held thereon to the specified first position, pressure clampers each removably installed on the aforementioned movable table in proximity and in correspondence to the tape feeding unit; a working head for cutting the electronic part off the electronic part assembly at the aforementioned first position and then holding and transferring this electronic part to a second position located apart from the moving path of the aforementioned movable table but near the surface of a printed substrate, to mount this electronic part on the printed substrate; a chute for guiding to the vicinity of the center of rotation of the aforementioned movable table, tape scraps which have been left over after the electronic parts have been cut off the taped electronic assemblies, which is located beneath the bottom surface of the movable table in correspondence with the aforementioned tape feeding unit; a tape cutter capable of cutting the aforementioned tape scraps, installed near the chute and between it and the center of rotation of the movable table, where it is not interfered with by this chute and the movable table. The device of the present invention has the effect of not being subjected to limitation in the direction of mounting the electronic parts on the printed substrate, in addition to the benefit of permitting random selection of electronic parts without making sequential arrangement of the electronic parts, and the effects of enabling easy unification and mounting and dismantling of the tape feeding unit and the electronic assembly and further, facilitates disposal of tape scraps by cutting them to a definite length, thereby permitting easy and quick execution of a part change without suffering tape dangling.

BRIEF DESCRIPTION OF THE DRAWINGS

FIG. 1(a) is a plan view of a resistor, FIG. 1(b) a plan view of a diode and FIG. 1(c) a plan view of a band shape part assembly used with the electronic part inserting device of an embodiment of this invention;

THE MOST PREFERABLE MODE FOR PRACTICE OF THE INVENTION

Figure 3:
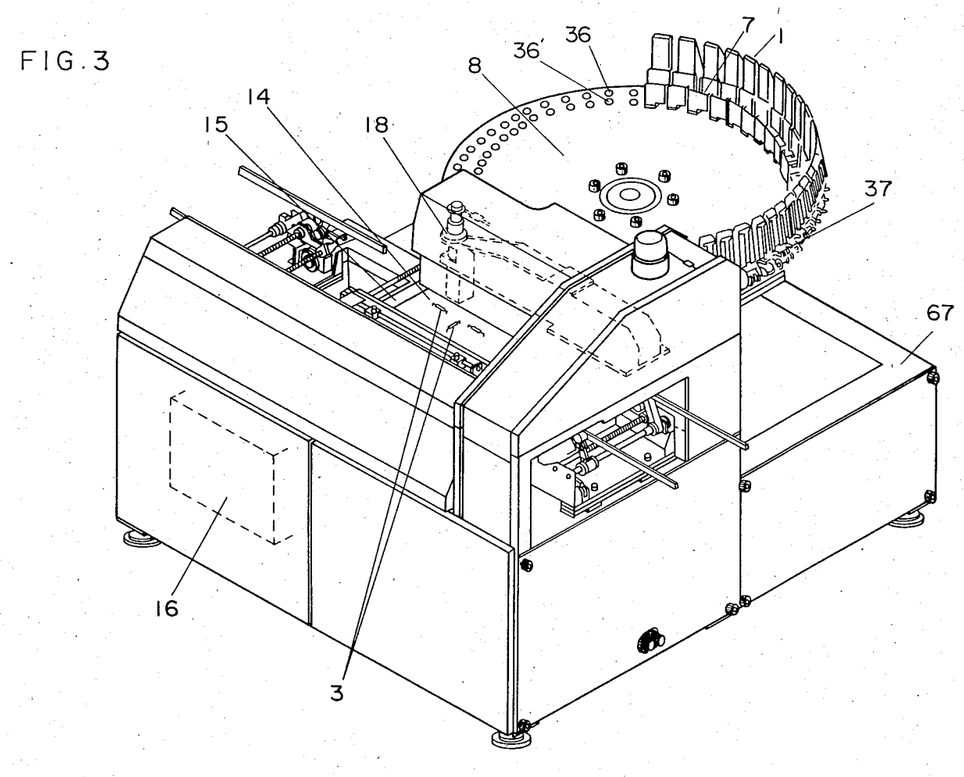
FIG. 3 is a perspective view of an electronic part inserting device of an embodiment of this invention.
Figure 4:
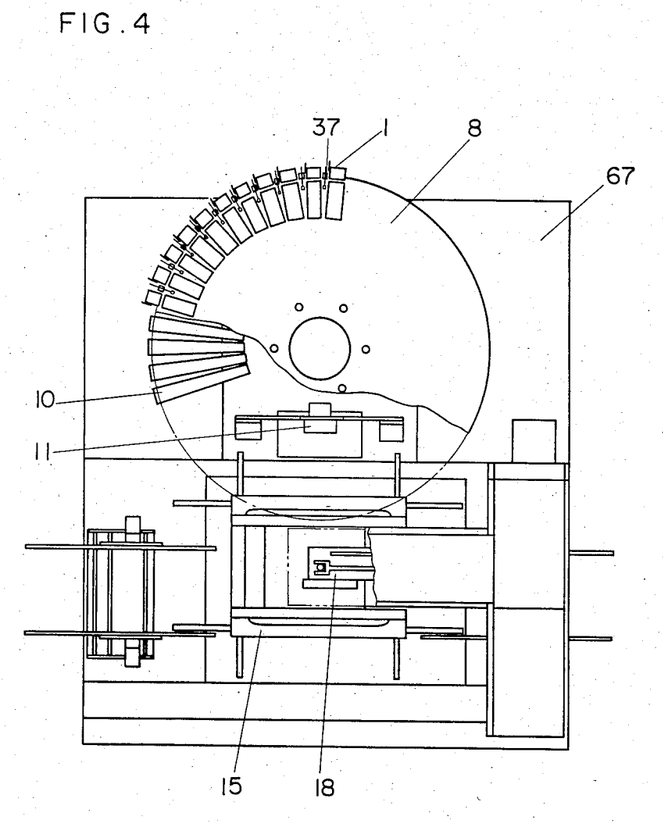
FIG. 4 is a partly broken plan view of this electronic part inserting device.
Figure 5:
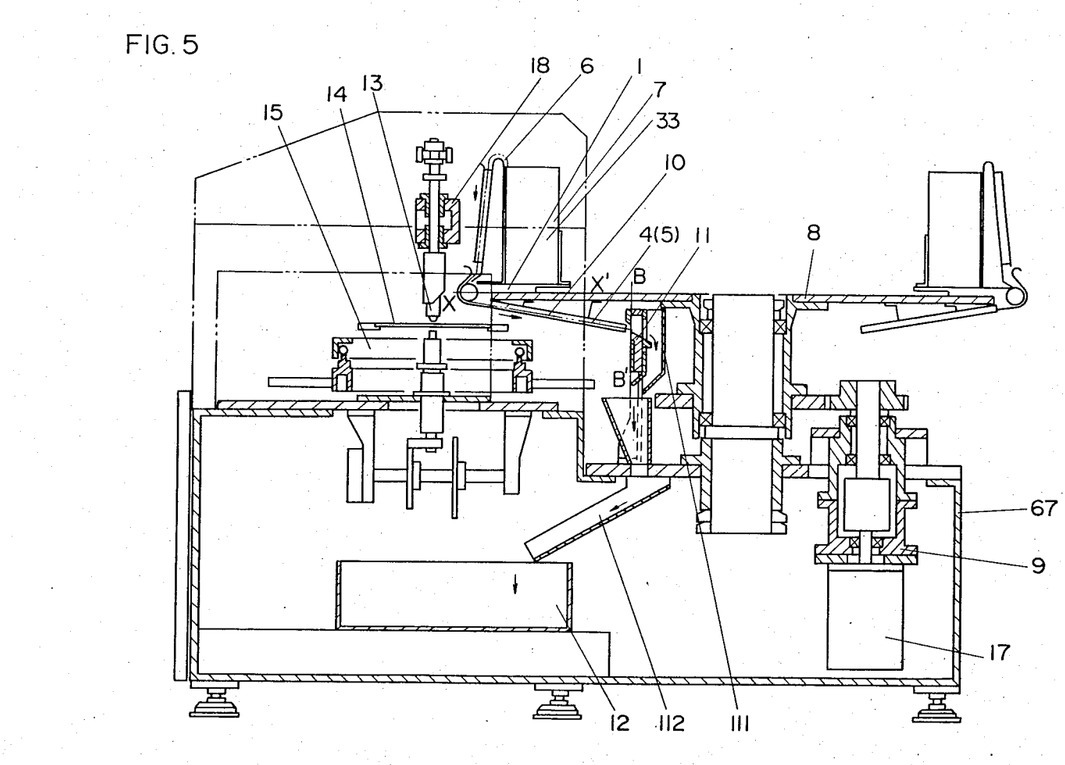
FIG. 5 is a side sectional view of the same.
Figure 6:
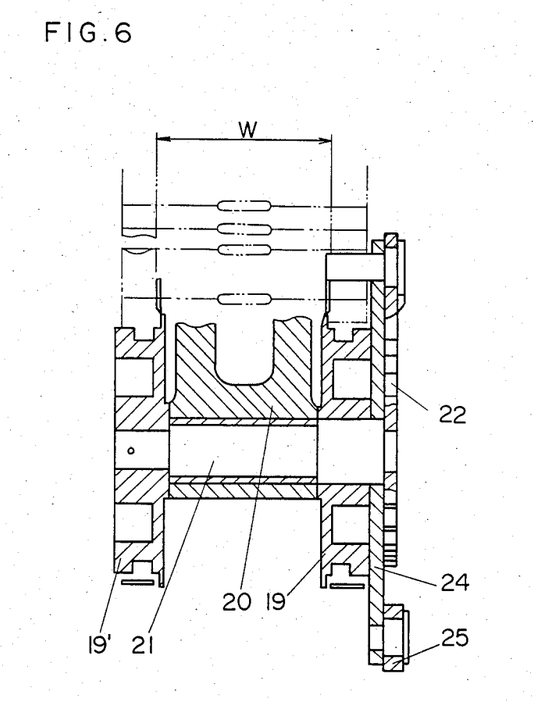
FIG. 6 is a partly broken sectional view of the tape feeding unit when inserting the electronic part.
Figure 7:
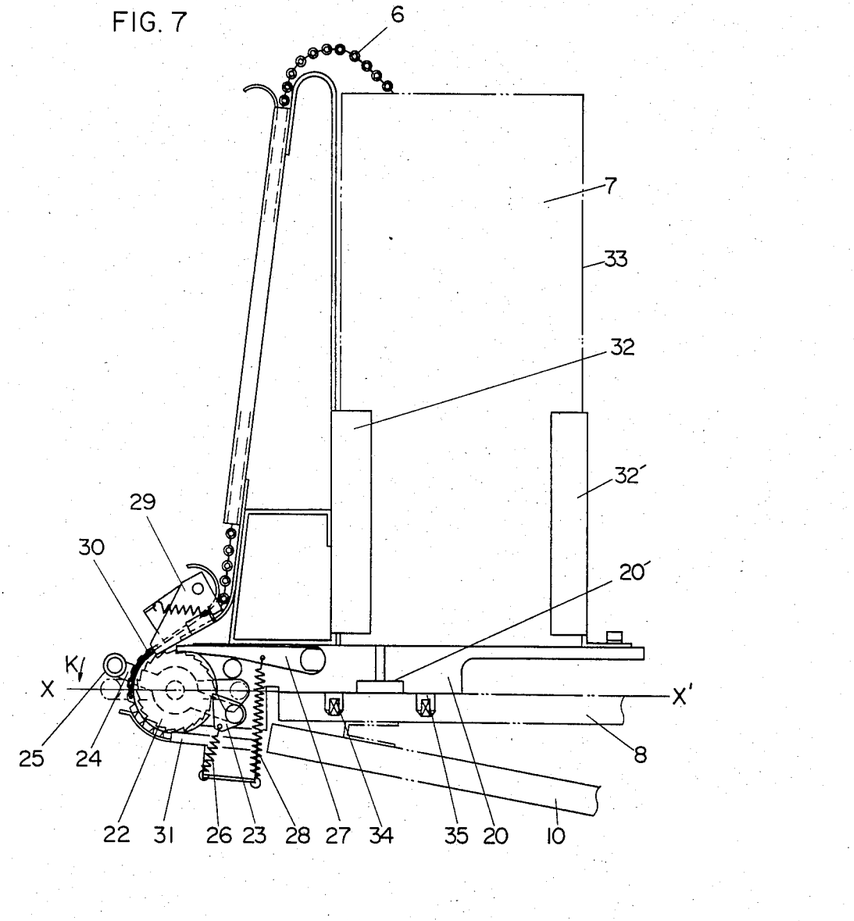
FIG. 7 is a side view of this tape feeding unit.
Figure 8:
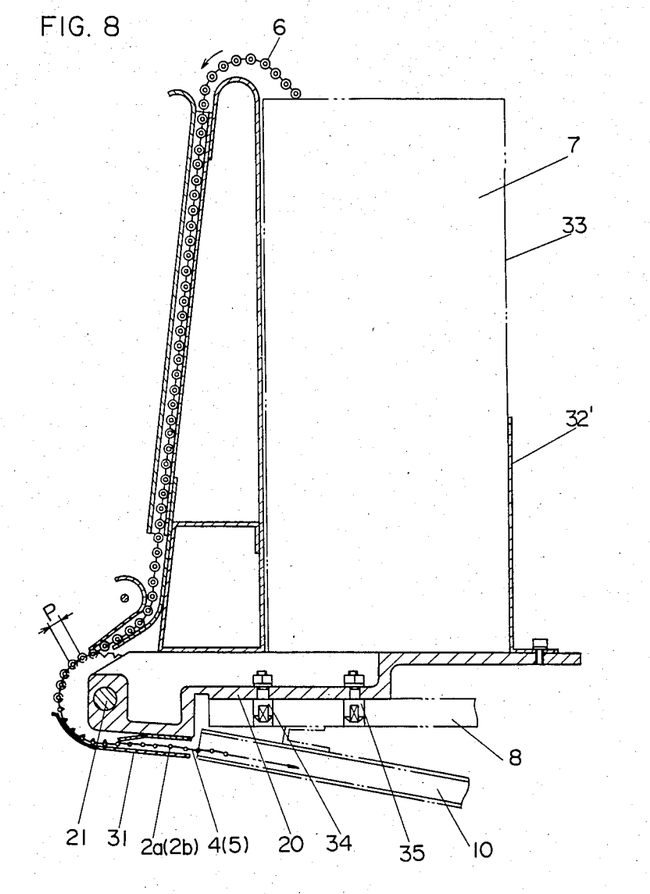
FIG. 8 is a side sectional view of this tape feeding unit.
Figure 9:
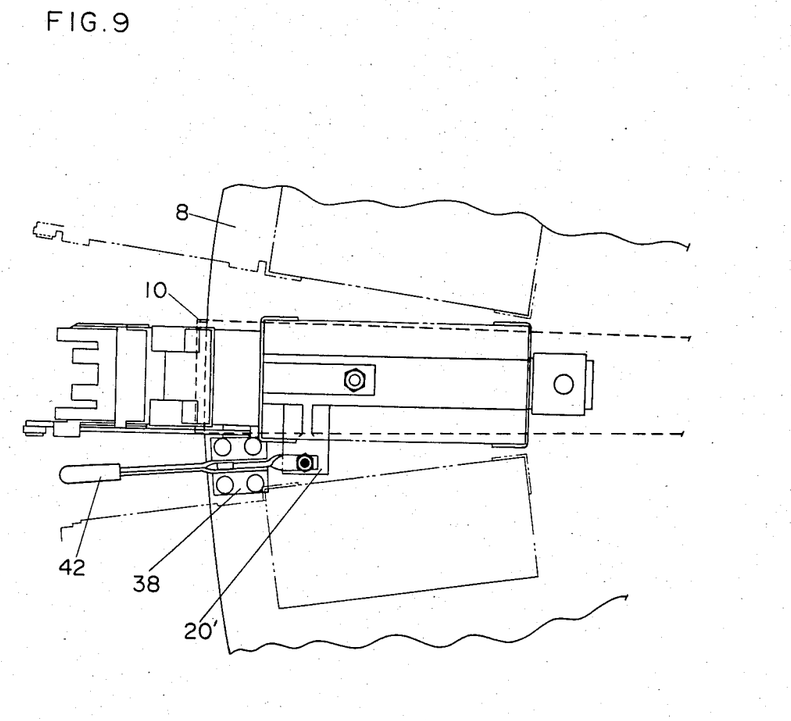
FIG. 9 is a plan view of this tape feeding unit.
Figure 10:
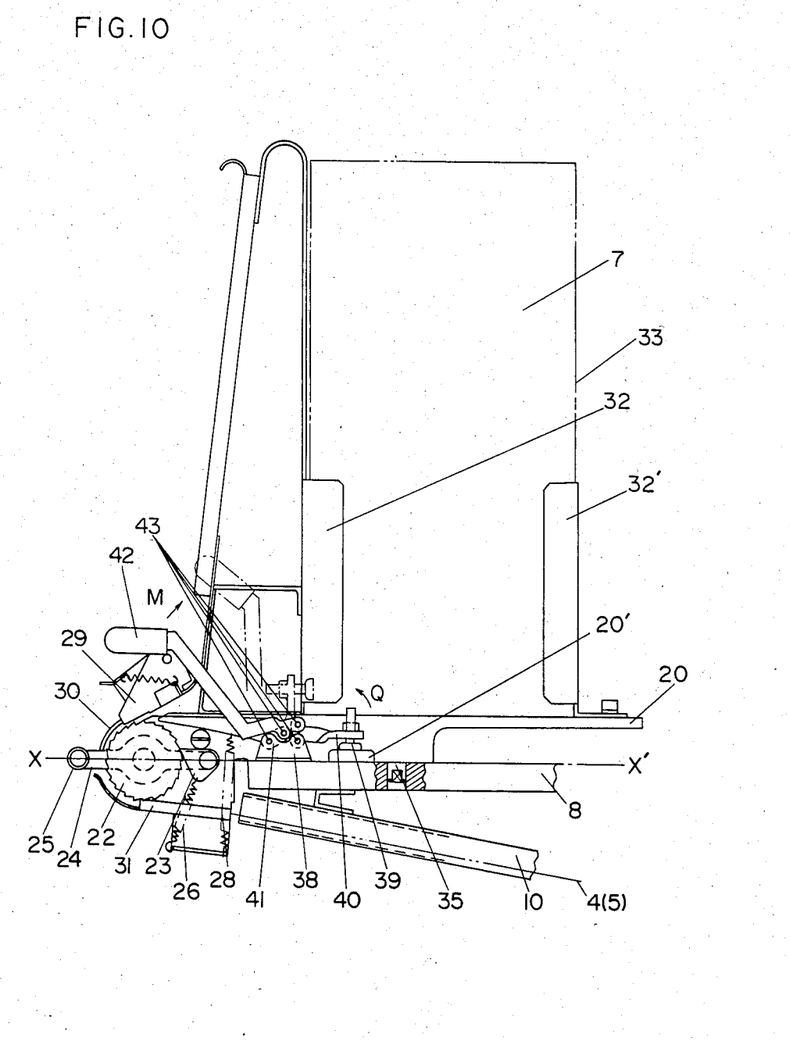
FIG. 10 is a side view partly in section of this tape feeding unit installed on the movable table.

The present invention will become more apparent from a description taken in connection with an embodiment of this invention and with reference to drawings starting with FIG. 3.

Numeral 1 designates a tape feeding unit which functions as a housing part 7 for a band shape part assembly 6. Each band shape part assembly is formed by fixing at equal intervals a plurality of electronic parts 3 having lead wires 2a and 2b coaxially extending therefrom with tapes 4 and 5 like paper, etc., which are readily curvable. The tape feeding unit also functions to supply the parts from the band shape assembly 6. Numeral 8 is a movable table for carrying a plurality of tape feeding units 1 and making a circular movement to arbitrarily move any one of the tape feeding units 1 to a specified part take-out position. The movable table contains a driving part 9 for moving the movable table 8 to the set position and a chute 10 for guiding out the tapes 4 and 5 from which the parts are cut off and the discharged tapes are accumulated in a scrap box 12 after being cut to a specified length by a tape cutter 11 (to be described later). Numeral 13 is a cutter unit for not only separating the lead wires from the tapes at the specified part take-out position, but for forming the lead wires into a specified shape and moving the lead wires by pivoting the cutter unit to a printed substrate 14 so that these lead wires are passed along a guide groove and inserted into the printed substrate. Numeral 15 is a substrate moving part for holding the printed substrate 14 and setting the inserting position in the printed substrate 14 by moving fore and aft and right and left. Numeral 16 denotes a driving control part for controlling the mutually interlocked operations between the aforementioned tape feeding unit 1, movable table 8, tape cutter 11, driving motor 17 for the movable table 8, inserting head 18 as a working head which operates in concert with the cutter unit 13 and the substrate moving part 15, etc.

First, the tape feeding unit 1 is discribed with reference to FIGS. 3–10. In this embodiment, as shown in FIG. 1c, parts of same type are put together with adhesive tapes 4 and 5 at equal intervals P. Numerals 19 and 19' denote feeding ratchet wheels for feeding out the band shape assembly 6 by a definite pitch, each of which has ratchets provided in agreement with the pitch P. The aforementioned ratchet wheels 19 and 19' are respectively fixed on the shaft 21 axially supported by the tape feeding unit body 20 at a dimension a little narrower than the taping width W and on one end of the shaft 21, a driving ratchet wheel 22 having same number of ratchets as that of the ratchet wheels 19 and 19' is mounted. A lever 24 having mounted thereon a ratchet 23 which engages with the ratchet wheel 22 is rotatably supported on the shaft 21 and on the other end of lever 24, opposite to the ratchet 23, a roller 25 is provided for relieving frictional resistance when the lever 24 is pushed. Numeral 26 designates a holding spring for the ratchet 23, and 27 a detent pawl for the ratchet wheel; thereby a timing for the ratchet wheels 19 and 19' and 22 is so adjusted that the taped parts are brought to the feeding line X—X' (a position where the part is cut by the cutter unit 13). Numeral 28 denotes a holding spring for detent pawl 27 for ratchet wheel. Numerals 29, 30 and 31 stand for staying plates for prevention of tapes' floating up; 32 and 32' are frames for holding therebetween parts housing box 33 which forms a parts housing space 7; both are fixed to the tape feeding unit body 20. This tape feeding unit 1 has fixing pins 34 and 35 at its base part; a plurality of tape feeding units 1 are engageable with coupling holes 36, 36' . . . provided at specified intervals in the movable table 8 and by means of a linked clamper 37 fixed to the movable table 8, the tape feeding unit body central part seat 20' is pressed and pivotally linked.

Then the linked clamper 37 is described further in detail: The linked clamper 37 has a clamper body 38, pressure lever 40 provided with a pressure means 39, lever 41 and a handle lever 42; this handle lever 42 is coupled with the clamper body 38 through pins 43 and rotatable with respect thereto. The linked clamper 37 is located at a position corresponding to the central part seat 20' which is projecting from the movable table 8 in the direction at approximately a right angle to the unit body 20.

By employing the structure as hereabove described, the lever 24 is turned in the direction indicated by the arrow mark K; as one tooth of the ratchet wheel 22 is fed, the ratchet wheels 19 and 19' will feed the taped part 3 by the taping pitch P, making it possible to feed the parts one by one to the specified feed line X—X'. And by pulling up the handle lever 42 of the linked clamper 37 in the arrow direction M by a small muscle force, the pressure lever 40 is moved in the direction of the arrow mark Q, permitting the tape feeding unit 1 to be removed from the movable table 8 by releasing the pressure.

Figure 11:
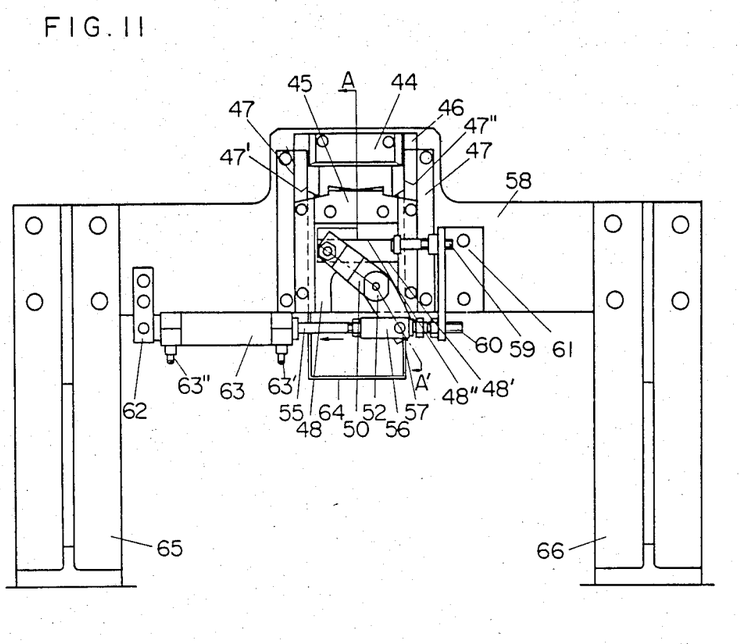
FIG. 11 is an elevation of a tape cutter.
Figure 12A:
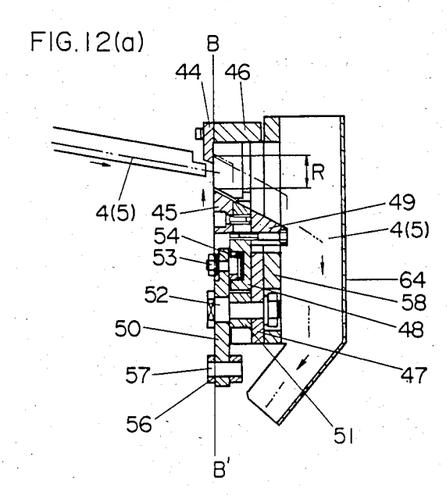
FIG. 12(a) is a sectional view along line A—A' shown in FIG. 11.
Figure 12B:
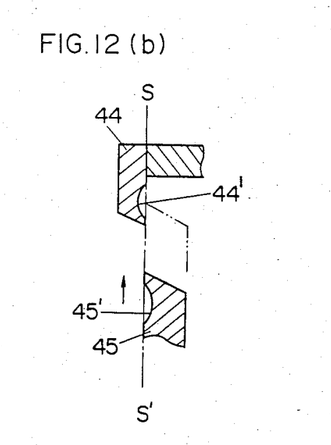
FIG. 12(b) shows enlarged sectional views of the principal parts of fixed and removable cutting edges.
Figure 13:
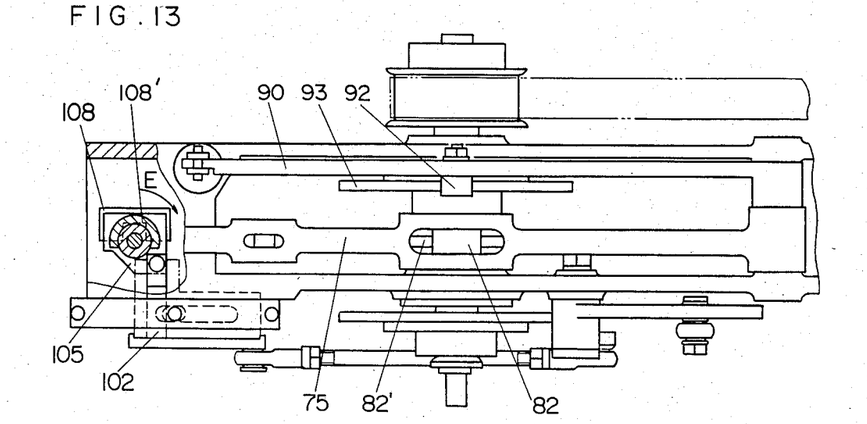
FIG. 13 is a plan view partly in section of an insertion head.
Figure 14:
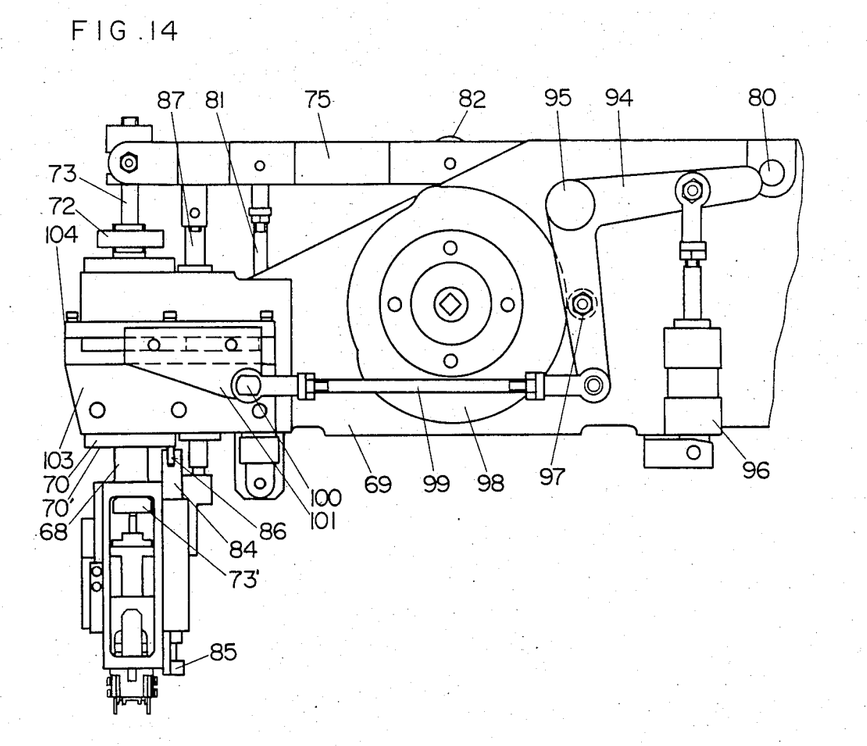
FIG. 14 is an elevation of the same.

In the following, the tape cutter 11 is described with reference to FIGS. 11, 12a and 12b. Numeral 44 designates a fixed cutting edge, and 45 a rotary cutting edge, both being cutting edges for cutting the tapes 4 and 5. On their surfaces along the line S—S', there are provided concavities 44' and 45' for discharging deposits produced after tapes have been cut. The fixed cutting edge 44 is held by a slider bracket 47 through a bracket 46, while the movable cutting edge 45 is mounted on sliders 48 which go up—down in concert along channels 47' and 47" formed in the slider bracket 47. Numeral 49 designates a guide block which is installed on the slider 48 to guide out tape scraps 4 and 5 which have been cut off.

Numeral 50 is a lever which is adapted for up—down motion of the slider 48 and which is rotatably mounted on a fulcrum shaft 52 held by a slider bracket 47 through a spacer 51. It has a swinger 54 which is movable to right—left in the grooves 48' and 48" of the slider 48 and which is rotatably attached on a pin 53, and it is coupled to a piston rod 55 through a block 56 and a pin 57. Numeral 58 denotes the body base of the tape cutter 11, which is engagingly holding the slider bracket 47, a bracket 61 on which stoppers 59 and 60 for regulating the stroke of the lever 50 are mounted, cylinder bracket 62, cylinder 63 and tape guide 64 and which is engagingly held by columns 65 and 66.

This tape cutter 11 is located near the delivery port of the chute 10 installed under the movable table 8 and is fixed to the body 67 through the columns on a line connecting the specified part-take-out position on the tape feeding unit 1 and the center of rotation of the movable table 8, without interfering with the chute 10 and the movable table 8.

The scraps 4 and 5 flow down through the chute 10 and are fed to a position beyond the cutting position B—B'. At this time, the tape cutter 11 is set at the position indicated in FIGS. 11 and 12. As air is fed to a cylinder 63 in this state through an air supply hose 63', a piston rod 55 moves in the arrow mark direction of FIG. 11 and the lever 50 turns upward with the fulcrum shaft 52 as the center. At the same time, the slider 48 and the movable cutting edge 45 are raised by a distance R. Simultaneously, tape scraps 4 and 5 are cut off at the position on the line B—B' and discharged through a guide 64.

Then the former state is resumed by switching the air to an air supply hose to 63". One cycle of operation of the tape cutter 11 has now been described herein above.

Next, the insertion head 18 is described with reference to FIGS. 13 through 17.

Numeral 68 designates an insertion shaft, is axially supported for up-down sliding motion through guide cylinders 70 and 71, with its level adjustable by means of a nut 72. Numeral 73 denotes a driving shaft which is slidable along its axis and supported in the inside hole of the insertion shaft 68 and which is coupled to a head lever 75 through rollers 74 and 74'. A pin 78 is slidable in a stepped part 73' of the driving shaft 73. The pin 78, which is abutted on a retainer 77, is pressed by a compression spring 76 with the spring pressure of the compression spring 76 so set that a rod 79 of the cutter unit 13 is pressured when inserting a part and that the pressurizing deformation due to error of the diameter of the part 3 may be prevented (refer to FIG. 16). A head lever 75 is supported by a fulcrum shaft 80 at its one end and abutted on a cam 82' through a cam follower 82 under the downward pulling pressure by a pulling cylinder 81. The insertion shaft 68, although subjected to the downward pulling pressure transmitted from the head lever, is engaged by the stepped part 73' of the drive shaft 73. Numeral 83 stands for a shaft-fitted pinion for rotating the cutter unit 13. Numeral 84 denotes a slide rack meshed with the shaft-fitted pinion 83, which has a compression spring not shown in the drawings installed therein, which spring placed in a bracket 85, is always pushing upward the slide rack 84, thereby abutting it on the bottom surface 70' of the guide cylinder 70 through a roller 86.

Numeral 87 designates a feed shaft for driving the lever 24 of the tape feeding unit 1, which is slidably supported by the insertion head body 69 and movable up and down along its axis. Numeral 88 denotes a feed block attached on the tip of the feed shaft 87, which abuts on a roller 25 of the aforementioned lever 24 when feeding the tapes. Numeral 89 stands for a pin coupling the shaft 87 with the feed lever 90. Numeral 91 designates a compression spring interposed between the insertion head body 69 and the shaft 87, which is always pressing the feed shaft 87 downward.

Figure 17:
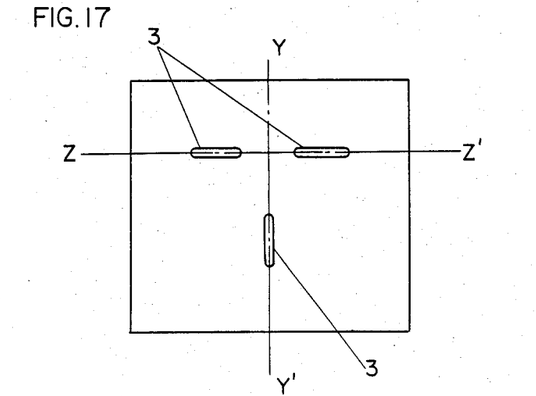
FIG. 17 is a diagram for explanation of the arrangement of parts.

The feed lever 90 is supported by the fulcrum shaft 80 at its end and is abutting on a cam 93 through a cam follower under the downward pulling pressure by the pulling cylinder not shown in the drawings. FIG. 17 illustrates a layout of parts 3. When inserting a part 3 in the Y—Y' line direction which is on the same plane as the Z—Z' line, the part 3 pinched by the cutter unit 13 along the Z—Z' line as previously described is changed to the Y—Y' line.

Referring to FIGS. 13, 14 and 15, 94 denotes a lever which subjected to the downward pulling pressure by the pulling cylinder 96, with the shaft 95 as the fulcrum, is abutted on a rotary plate cam 98 through a cam follower 97. The rod 99 is attached to a plate 101 through a pin 100.

A sliding body 102 is clamped by a plate 101, is internally in contact with guide plates 103 and 104 fixed on the insertion body 69, to be slidably held thereby and is slidably holding a slider 107 rotatably engaged on a pin 106 fixed on a lever 105. A guide 108, together with the lever 105, holds and slidably axially support the insertion shaft 68, mating its concavity 108' with a fitting part formed on the insertion shaft 68. The insertion shaft 68 is coupled to the driving shaft 73 at a ball shape concavity 73" through a steel ball 109 and axially supported by a guide cylinder 71 for free rotation and axial movement. With the aforementioned structure, by turning the rotary plate cam 98, the driving shaft 73 may be turned clockwise by 90° (arrow mark E line Y—Y') and it may be reset to the line Z—Z' by turning it counterclockwise. On the guide cylinder 71, a groove 71' for undoing the coupling between the insertion shaft 68 and the driving shaft 73, when inserting a part, is internally provided.

Figure 1:
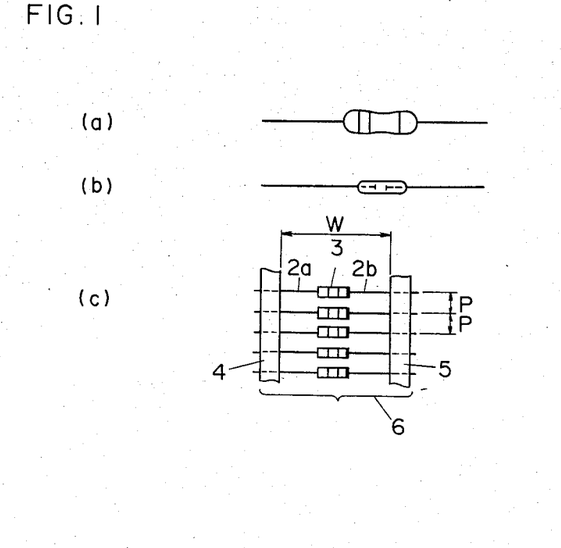
Figure 15:
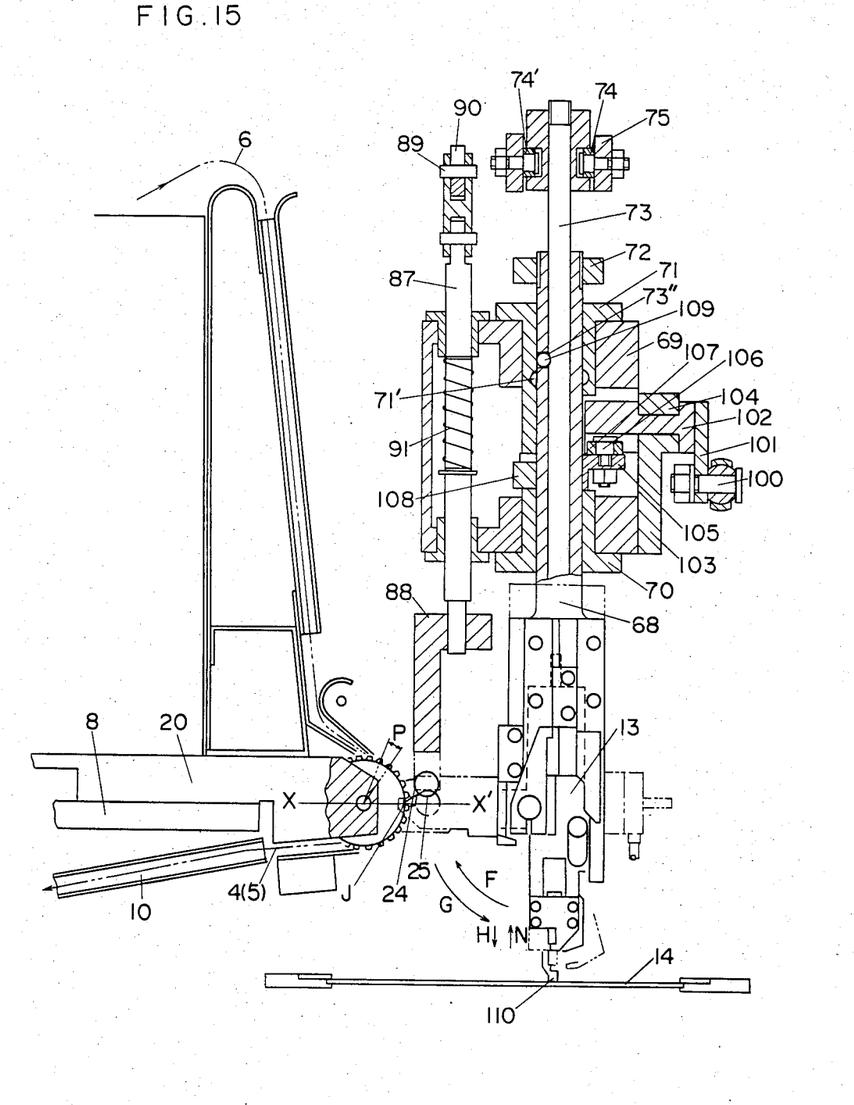
FIG. 15 is a side view partly in section of the same.
Figure 16:
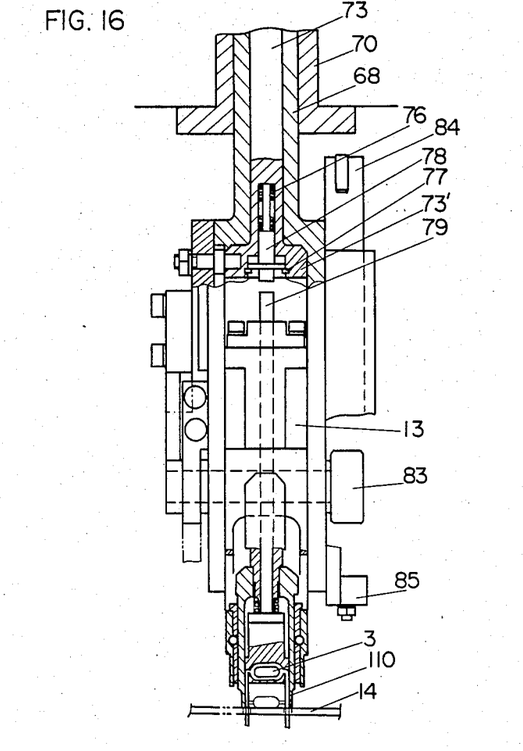
FIG. 16 is an elevation partly in section of the principal part of the same.

In the following, the operations in inserting electronic parts 3 are described with reference to FIGS. 5, 13, 14, 15 and 16:

FIG. 15 represents the origin point (start position) in the one cycle of the inserting operation, in which the cutter unit 13 is set by the turning of the movable table 8 to a position where it is free from collision with the tape feeding unit 1 in its specified position. Under this state, by the turning of the cam 82' by which the operation of the head lever 75 has been set beforehand, the driving shaft 73 coupled to the head lever 75 is brought up and by the actions of the shaft-fitted pinion 83 and the slide rack 84, the cutter unit 13 is pivoted from a vertical position to a horizontal position in the direction of the arrow F, to be set on the line X—X'. Simultaneously therewith, the feed shaft 87 descends due to the turning of the cam 93 by which the operation of the feed lever 90 is set; then, the feed block 88 attached to the tip of the shaft pressures the lever 24 through the roller 25 of the tape feeding unit 1, thereby transferring to the line X—X' the electronic part assembly 6 which is placed one pitch (P) before the line X—X'. Then using a mechanism of the cutter unit 13, not shown in the drawings, the lead wires 2a and 2b of the electronic part assembly (FIG. 1) are cut; formed and held. Simultaneously, the driving shaft 73 and the insertion shaft 68 begin to go down and the cutter unit 13 is pivoted (in the G direction) by the aforementioned shaft-fitted pinion 83 and the slide rack 84, to return to its original position. The driving shaft 73 and the insertion shaft 68 begin to go down (in the H direction) and, as a result, the insertion shaft 68 descends, until the nut 72 by which it is hung comes to abut on the guide cylinder 71. Under this condition, a guide 110 located on the cutter unit 13, corresponding to the inserting hole of the printed substrate 14 and holding the cut and formed lead wires 2a and 2b, is so positioned in level that it is brought on the top surface of the printed substrate 14. As the driving shaft 73 further descends, the steel ball 109 coupling the driving shaft 13 with the inserting shaft 68 moves to the groove 71' of the guide cylinder 71; then, only the driving shaft 73 descends and the pin 78, which is internally in contact with the stepped part 73' of the driving shaft 73, pressures a rod 79 placed in the cutter unit 13, thereby inserting the electronic part 3 into the insertion holes in the printed substrate 14. After the insertion of the part has been finished, the driving shaft 73 starts rising (in the D direction), then to return to its former position at the origin. The aforementioned description explains the inserting operations in one cycle.

As the electronic part assembly 6 has passed the line X—X', the tapes 4 and 5 flowing down the chute 10 flow down the chute 10 successively and are discharged over the line B—B'. Then the tape cutter, as soon as the electronic part assembly 6 is transferred to the line X—X', begins operating, to cut the tapes 4 and 5 which have crossed the line B—B'. The tape scraps are then accumulated in a waste box 12 after passing through a guide cylinder 111 and guide chute 112.

FIELD OF INDUSTRIAL UTILIZATION

The present invention is characterized in that an insertion head goes to specified positions to take out parts held on tapes. The present invention avoids the method of feeding to a fixed working insertion head tapes on which electronic parts are sequentially assembled in the fitting order or the method of sequentially taking out and inserting parts held on tapes which have been fed to specified positions, using a turret type taking-out mechanism of an insertion. In the present invention, the insertion head goes to specified positions in every cycle to take out parts held on tapes which have been fed to these positions and at other different positions. The insertion head performs the fitting work for mounting the parts on a printed substrate, so that the necessary parts may be randomly taken out by the insertion head and then, mounted on the printed substrate. The invention provides a pressure clamper for fixing the tape feeding unit to a movable table which simplifies the attaching and detaching by unifying the tape feeding unit with the electronic part assembly. In addition, the invention provides a tape cutter for cutting the tape scraps to a specified length after the parts have been cut off the electronic part assembly, thus parts replacement work is facilitated without permitting tape scraps to coil around the tape feeding unit.

What is claimed is:

1. An electronic parts mounting device, comprising:
a rotatable support, said rotatable support having a disc shape and a center of rotation;
a tape feeding means removably mounted on and transferred by said rotatable support, said tape feeding means holding and intermittently feeding electronic part assemblies to a first position along a moving path of said rotatable support, each of said electronic part assemblies having a plurality of electronic parts held at specified intervals along tapes;
clamping means, removably mounted on said rotatable support, for removably clamping said tape feeding means to said rotatable support;
an insertion head for removing a desired electronic part in said first position from an electronic part assembly, said insertion head holding and transferring said electronic part to a second position near the surface of a printed substrate, said second position being spaced from said first position and away from the moving path of said rotatable support;
guiding means, located below a bottom surface of said rotatable support in correspondence with said tape feeding means, for guiding tape scraps left over after said electronic parts have been removed from respective electronic part assemblies;
tape cutting means for cutting said tape scraps, said tape cutting means located adjacent said guiding means but between said guiding means and said center of rotation of said rotatable support such that said tape cutting means does not interfere with rotation of said rotatable support or said guiding means;
substrate support means, located below said insertion head, for moving a printed substrate in a plane to a desired position; and
drive control means, operably connected to at least said rotatable support and said substrate support means, for moving said rotatable support to a position where a specified tape feeding means can intermittently feed a desired electronic part to said first position and for moving said substrate support means to a position where it is desired to mount said electronic part on said printed substrate.

2. The electronic parts mounting device of claim 1, wherein a storage space is provided in said tape feeding means for integrally holding said electronic part assemblies.

3. The electronic parts mounting device of claim 1, wherein each of said tape feeding means includes a body center part and at least one protrusion extending from said body center part, said clamping means mounted on said rotatable support for clamping said at least one protrusion to said rotatable support.

4. The electronic parts mounting device of claim 1, wherein said tape cutting means includes at least one cutting edge surface, said at least one cutting edge surface having a concavity for cutting tape scraps.

* * * * *